(12) United States Patent
Hsu et al.

(10) Patent No.: US 11,343,933 B2
(45) Date of Patent: May 24, 2022

(54) CIRCUIT BOARD AND CABLE MANAGEMENT STRUCTURE THEREOF

(71) Applicant: PEGATRON CORPORATION, Taipei (TW)

(72) Inventors: Wei-Chih Hsu, Taipei (TW); Pen-Uei Lu, Taipei (TW); Mao-Hsiang Huang, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 17/094,551

(22) Filed: Nov. 10, 2020

(65) Prior Publication Data

US 2021/0144874 A1   May 13, 2021

(30) Foreign Application Priority Data

Nov. 12, 2019  (TW) .................................. 108214992

(51) Int. Cl.
*H05K 7/06* (2006.01)
*H05K 5/02* (2006.01)
*H05K 7/14* (2006.01)

(52) U.S. Cl.
CPC ...................................... *H05K 7/06* (2013.01)

(58) Field of Classification Search
CPC .......... H05K 5/0247; H05K 1/18; H05K 7/06; H05K 7/1402
See application file for complete search history.

(56) References Cited

U.S. PATENT DOCUMENTS

| 3,842,190 A * | 10/1974 | Towell ..................... H05K 7/06 174/268 |
| 2012/0000702 A1* | 1/2012 | Hong ....................... H05K 7/06 174/480 |

FOREIGN PATENT DOCUMENTS

| CN | 103985522 A | 8/2014 |
| WO | WO-2017019247 A1 | 2/2017 |

\* cited by examiner

*Primary Examiner* — Hoa C Nguyen
*Assistant Examiner* — Amol H Patel
(74) *Attorney, Agent, or Firm* — Muncy, Geissler, Olds & Lowe, P.C.

(57) ABSTRACT

A circuit board includes a substrate, a plurality of electronic components disposed on the substrate, and at least one cable management structure. The substrate is provided with a first surface and a second surface. The first surface and the second surface are correspondingly disposed. The cable management structure is used for limiting a configuration direction of at least one cable. The cable management structure includes at least one cable management column and at least one cable collection member. The cable management column is disposed on the first surface of the substrate. The cable collection member is disposed at an edge of the substrate, and the cable management column is located beside the cable collection member. The cable is capable of bypassing the cable management column and passing through the cable collection member from the edge of the substrate to the second surface, to achieve cable management and positioning effects.

10 Claims, 4 Drawing Sheets

CIRCUIT BOARD AND CABLE MANAGEMENT STRUCTURE THEREOF

BACKGROUND

Technical Field

The disclosure relates to a cable management structure, and in particular, to a cable management structure applied to a circuit board.

Related Art

With the advancement of electronic technologies, various electronic devices are continuously developed. Most electronic components in an electronic devices are integrated on a circuit board. However, some electronic modules still need to be electrically connected through a cable.

To effectively accommodate the connection cable in the electronic device, a cable clamp structure or an adhesive accessory is used for fixing the connection cable on a specific cabling path in the conventional technology. Alternatively, the connection cable is enabled to pass through a through hole of the circuit board, to limit the connection cable in the area. However, the use of the cable clamp structure for fixing the connection cables causes a sheath of the connection cable to break due to over-tightening of the cable clamp, resulting in damage or disconnection of the connection cable. The use of the adhesive accessory for fixing the connection cable causes an increase in material costs and assembling hours due to a need for additionally adding the accessory. In addition, because a manner for enabling the connection cable to pass through the through hole of the circuit board requires a perforation operation in the assembling process, the assembling hours are increased, and the connection cable may still easily slip.

Therefore, it is necessary to provide a new cable management structure, which can efficiently accommodate the connection cable in the electronic device, and solve the foregoing problems.

SUMMARY

The main objective of the disclosure is to provide a circuit board and a cable management structure thereof, which achieve effects of assembly convenience of a cable and damage prevention of a cable sheath.

To achieve the foregoing objective, the disclosure provides a cable management structure, which is used for limiting a configuration direction of at least one cable. The cable management structure includes a substrate, at least one cable management column, and at least one cable collection member. The substrate is provided with a first surface and a second surface. The first surface and the second surface are correspondingly disposed. The cable management column is disposed on the first surface of the substrate. The cable collection member is disposed at an edge of the substrate. The cable management column is located beside the cable collection member. The cable is capable of bypassing the cable management column and passing through the cable collection member from the edge of the substrate to the second surface.

In the disclosure, the cable collection member includes at least one through groove and at least one extension portion. Each through groove is disposed at the edge of the substrate. The extension portion extends out from the edge of the substrate and surrounds at least one portion of the through groove, and the extension portion limits the cable in the through groove.

In the disclosure, the cable management structure further includes: at least one isolation unit, disposed at an edge of the cable collection member and separated from the cable management column. A portion of the cable passing through the cable collection member from the second surface to the first surface and a portion of the cable bypassing the cable management column are separated on two sides of the isolation unit.

In the disclosure, the cable passes through the cable collection member from the second surface to the first surface, and extends back to the second surface through the edge of the substrate after bypassing the cable management column.

In the disclosure, the cable tightly fits the cable management column, and the configuration direction of the cable is U-shaped.

In the disclosure, the cable management column is arc-shaped, round or square.

To achieve the foregoing objective, the disclosure further provides a circuit board, which includes the foregoing cable management structure and a plurality of electronic components disposed on the substrate.

Based on the foregoing, in the cable management structure of the disclosure, the cable management column and the cable collection member are disposed to enables the cable to pass through the cable collection member from the second surface of the substrate to the first surface, and bypass the cable management column to enable the cable to be stably positioned, fixed, or limited on the circuit board without damage, so as to improve the assembly convenience, and prevent the cable sheath from being damaged. In addition, the cable of the disclosure is configured in a U-shaped or horseshoe-like direction manner, and the cable is stably fixed at the configuration direction using a friction force. Moreover, the cable collection member of the disclosure may be optionally designed with an extension portion, and the cable is fixed on the cable collection member using an effect that the extension portion has elastic deformation.

DETAILED DESCRIPTION

To enable the examiner to understand the technical content of the invention better, descriptions of specific preferred embodiments are provided below particularly.

Figure 1:
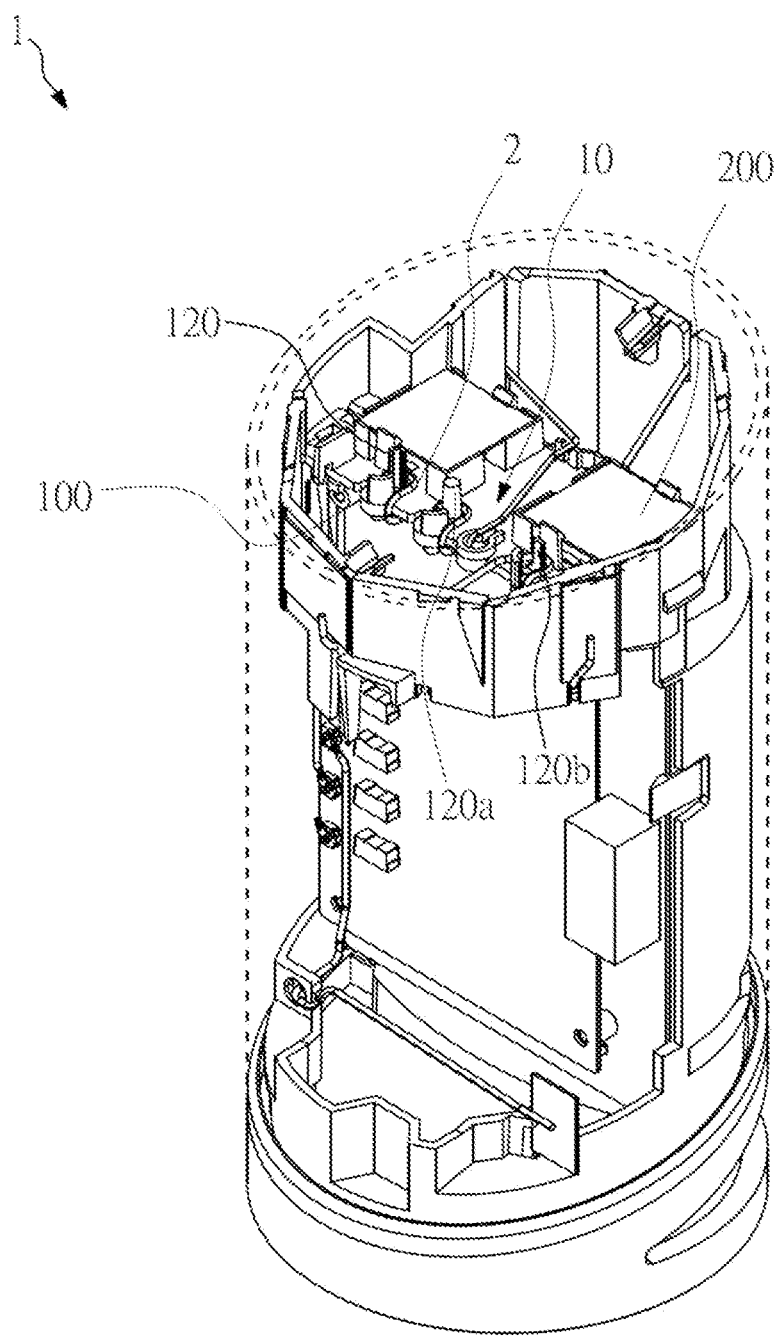
FIG. 1 is a schematic diagram of a circuit board disposed on an electronic device according to an embodiment of the invention.
Figure 2:
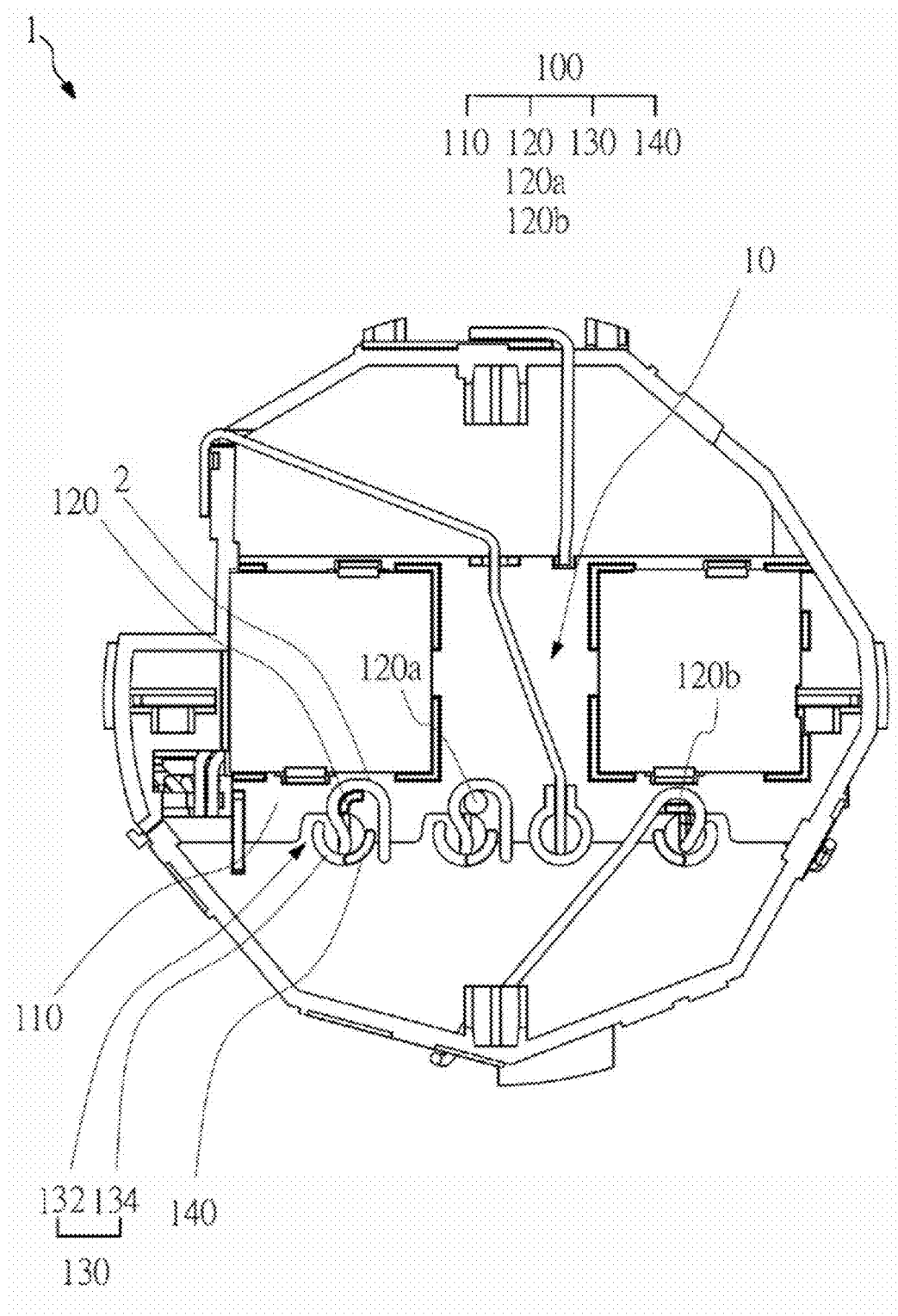
FIG. 2 is a top view of the electronic device of FIG. 1.
Figure 3:
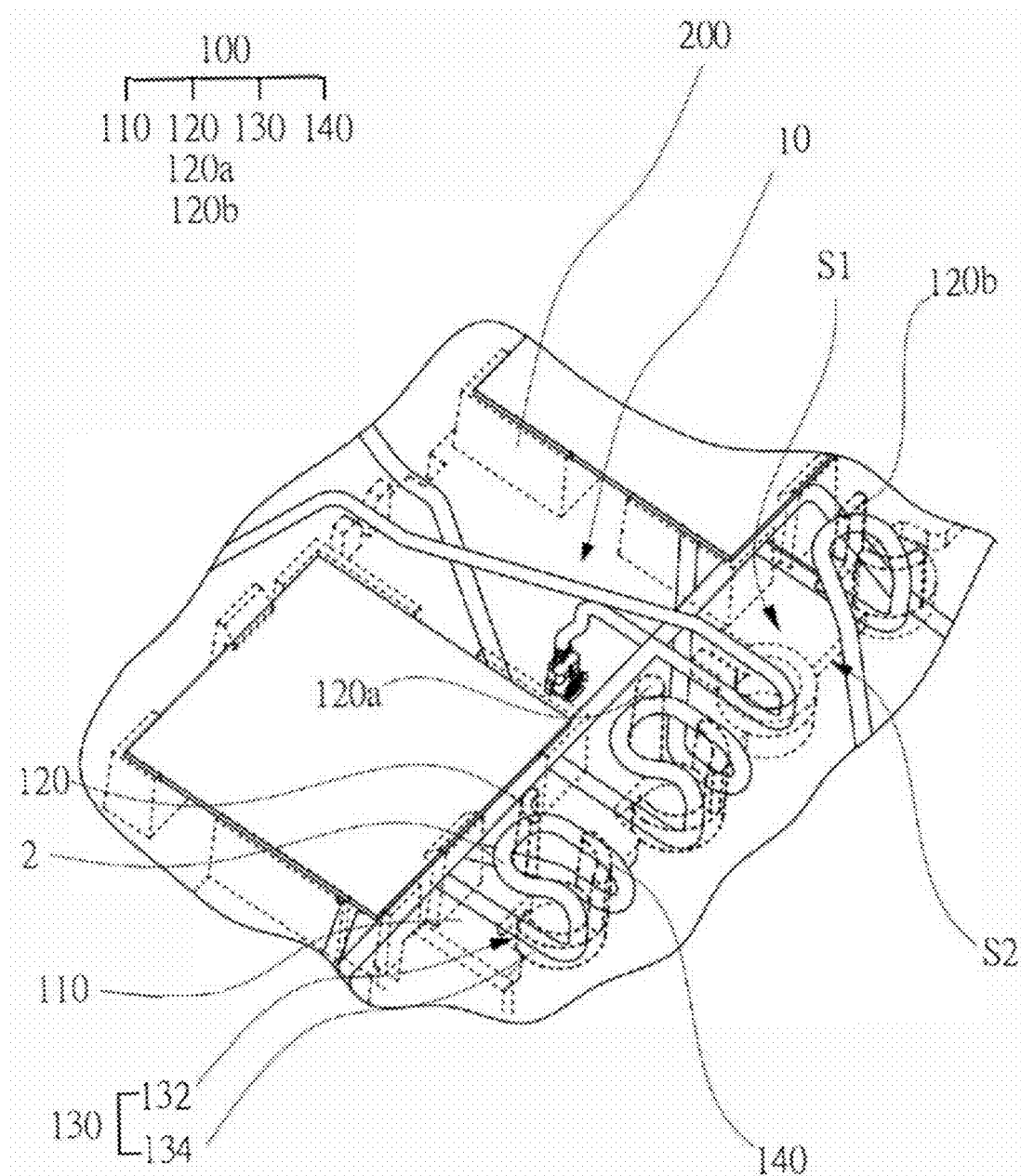
FIG. 3 is an enlarged three-dimensional view of a portion of the circuit board of the electronic device of FIG. 2.

FIG. 1 is a schematic diagram of a circuit board disposed on an electronic device according to an embodiment of the invention. FIG. 2 is a top view of the electronic device of FIG. 1. FIG. 3 is an enlarged three-dimensional view of a portion of the circuit board of the electronic device of FIG. 2. Referring to FIG. 1, FIG. 2, and FIG. 3 first, a circuit board 10 of this embodiment, for example, is disposed in an electronic device 1. The electronic device 1, for example, is an antenna device. In this embodiment, the circuit board 10 is mainly formed by at least one cable management structure 100 and a plurality of electronic components 200. The cable management structure 100 of this embodiment may effectively separate a plurality of cables 2 in the antenna device, to prevent sheaths of the cables from being damaged due to entanglement or mutual friction between the cables 2. In other words, the cable management structure 100 of this embodiment achieves effects of assembly convenience of the cable 2 and damage prevention of the cable sheath. The following describes the cable management structure 100 in detail.

Based on the foregoing, the cable management structure 100 of this embodiment is used for limiting a configuration direction of at least one cable 2. The cable management structure 100 includes a substrate 110, a plurality of cable management columns 120, 120a, and 120b, and a plurality of cable collection members 130. The cable management column 120 of this embodiment is arc-shaped, the cable management column 120a is round, and the cable management column 120b is square. No limitation is imposed herein. The arc-shaped or round cable management columns 120, and 120a may prevent the sheath of the cable from being damaged, and the square cable management column 120b may be applied in a relatively small space. In addition, quantities of the cable management columns 120, 120a, and 120b and the cable collection members 130 are not limited to be plural, and may be changed to more than one according to design requirements.

In this embodiment, the substrate 110 is provided with a first surface S1 and a second surface S2. The cable management columns 120, 120a, and 120b are disposed on the first surface S1 of the substrate. The cable collection member 130 is disposed at an edge of the substrate 110, and is in communication with the first surface S1 and the second surface S2 of the substrate 110. In addition, the plurality of cable management columns 120, 120a, and 120b is correspondingly disposed beside the plurality of cable collection members 130.

Specifically, in this embodiment, each cable collection member 130 includes at least one through groove 132 and at least one extension portion 134. Each through groove 132, for example, is disposed at the edge of the substrate 110, and the extension portion 134, for example, extends out from the edge of the substrate 110. Further, in this embodiment, for example, a plurality of through grooves 132 is disposed at the edge of the substrate 110, and each extension portion 134, for example, corresponding to the through grooves 132, extends out from the edge of the substrate adjacent to the through grooves 132. In this embodiment, the extension portion 134, for example, is in an arc-shaped structure. The extension portion, for example, surrounds at least one portion of the corresponding through grooves 132, thereby effectively limiting the cable 2 in the through groove 132. On the other hand, because the extension portion 134, for example, is in the arc-shaped structure extending from the edge of the substrate 110, one end of the extension portion is a free end, and the other end of the extension portion is a fixed end, the extension portion 134 is also in an elastic structure, and an elastic force of the extension portion is available for a worker to roughly push the extension portion 134 aside to place the cable 2 into the through groove 132. In addition, further based on a case in which the extension portion 134, for example, surrounds at least one portion of the corresponding through groove 132, the cable 2 may also be placed in the through groove 132 from a gap not surrounded by the extension portion 134, to fix the cable 2 by using the cable collection member 130. In this way, when the cable 2 passes through the cable collection member 130 from the second surface S2 to the first surface S, the cable 2 can be effectively limited in the through groove 132. Further, the cable 2 applied to the cable management structure 100 of this embodiment bypasses the cable management column 120 and passes through the cable collection member 130, and reaches the second surface S2 from the edge of the substrate 110, to achieve better cable management and positioning effects by using the cable management column 120.

In addition, the cable management structure 100 of this embodiment may further include at least one isolation unit 140. Similar to the cable management column 120, the isolation unit 140 of this embodiment, for example, is also disposed corresponding to the cable collection member 130. That is, the isolation unit 140 of this embodiment is also disposed at an edge of the cable collection member 130, and is also separated from the cable management column 120 disposed beside the cable collection member 130. The isolation unit 140 of this embodiment, for example, is connected to both the substrate 110 and the extension portion 134, thereby strengthening the structural strength of the cable collection member 130. It is worth mentioning that, the isolation unit 140 of this embodiment is disposed to separate a portion of the cable 2 passing through the cable collection member 130 from the second surface S2 to the first surface S1 from a portion of the cable 2 bypassing the cable management column 120 on two sides of the isolation unit, so that a portion of the cable 2 bent after passing through the cable management column 120 does not rub against a portion of the cable 2 before being bent. In other words, the sheath of the cable 2 applied to the cable management structure 100 of this embodiment can have better integrity and is not damaged due to the friction between the cables.

Preferably, the cable 2 applied to the cable management structure 100 of this embodiment can pass through the cable collection member 130 from the second surface S2 to the first surface S1, and extend back to the second surface S2 through the edge of the substrate 110 after bypassing the cable management column 120. In this way, the configuration direction of the cable 2 applied to the cable management structure 100 of this embodiment, for example, is U-shaped, inverted U-shaped or horseshoe-like. Further, in the invention, the cable 2 applied in the embodiment tightly fits the cable management column 120, to achieve a better cable management effect.

Figure 4:
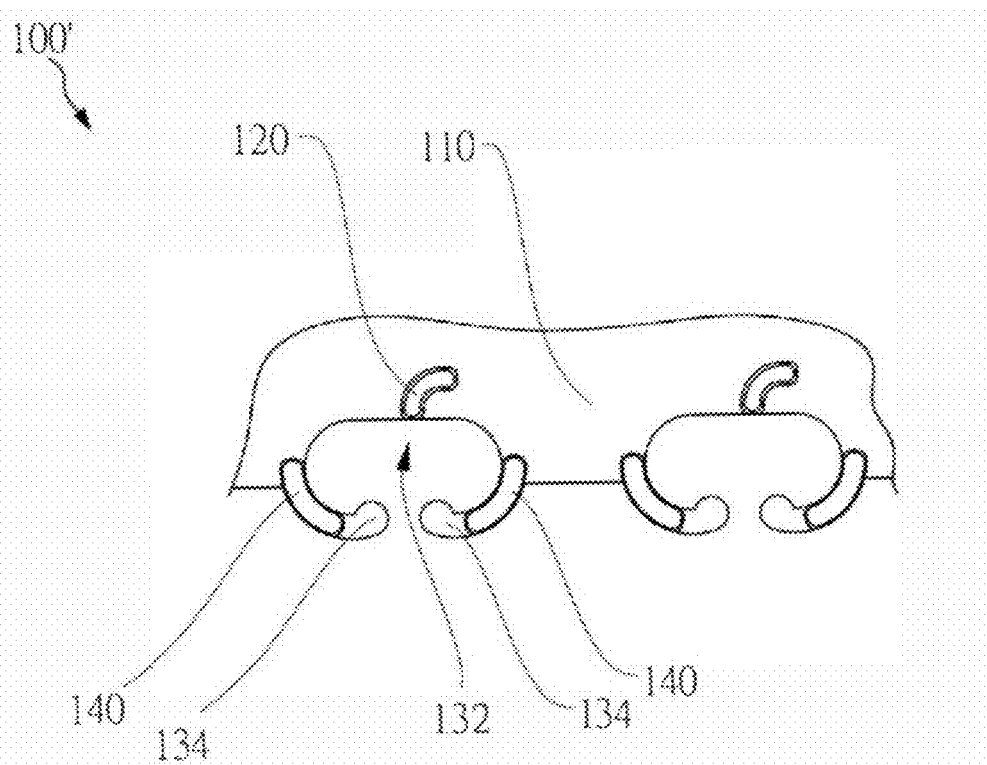
FIG. 4 is a schematic diagram of a cable management structure according to another embodiment of the invention.

FIG. 4 is a schematic diagram of a cable management structure according to another embodiment of the invention. Referring to FIG. 4, in a preferred embodiment, the cable management structure 100', for example, may be provided with two extension portions 134. The two extension portions 134, for example, extend out from two corresponding sides of the through groove 132. Specifically, the two extension portions 134 extend out oppositely from the edge of the substrate adjacent to the through groove 132. Same as the foregoing embodiments, in the cable management structure 100', the extension portion 134, for example, is also in arc-shaped structure, and the two extension portions 134, for example, surround at least one portion of the corresponding through groove 132, thereby effectively limiting the cable 2 in the through groove 132. In addition, in the cable management structure 100', an isolation unit 140 is also provided, so that a portion of the cable 2 bent after passing through the cable management column 120 does not rub against a portion of the cable 2 before being bent. In the cable management structure 100' for example, two isolating units 140 are provided, and each isolating unit 140 is also connected to both the substrate 110 and the extension portion 134, thereby strengthening the structural strength of the cable collection member 130.

Figure 5:
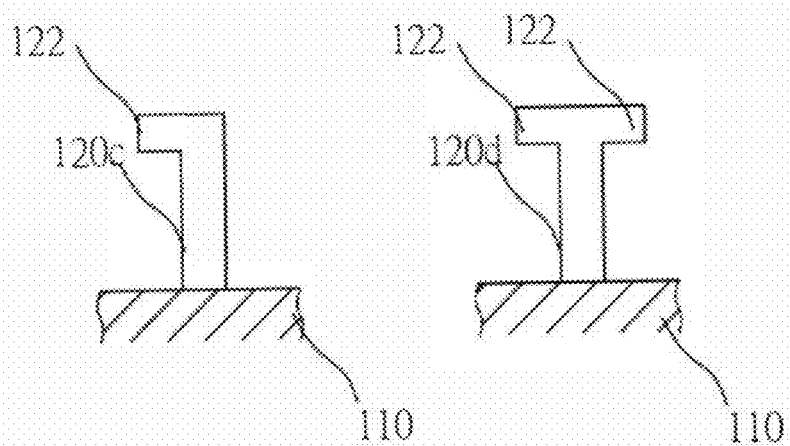
FIG. 5 is a schematic diagram of a cable management column according to another embodiment of the invention.

FIG. 5 is a schematic diagram of a cable management column according to another embodiment of the invention. Referring to FIG. 5, in a preferred embodiment, a top portion of a cable management column 120c may also be provided with a protrusion structure 122 protruded to prevent the cable from being separated and is inverted L-shaped. A top portion of another cable management column 120d may be provided with two protruding structures 122 protruded to prevent the cable from being separated and is T-shaped. The protrusion structures 122 at the top portions of the cable management columns 120c and 120d may further prevent the cable from being separated, thereby more stably limiting the position of the cable.

Based on the foregoing, in the circuit board of the invention, in the cable management structure, the cable management column and the cable collection member are disposed to enable the cable to pass through the cable collection member from the second surface of the substrate to the first surface, and bypass the cable management column to enable the cable to be stably fixed or limited on the circuit board without damage, so as to improve the assembly convenience, and prevent the cable sheath from being damaged. In addition, the cable of the invention is configured in a U-shaped, an inverted U-shaped or horseshoe-like direction manner, and the cable is stably fixed at the configuration direction using a friction force. Moreover, the cable collection member of the invention may be optionally designed with at least one extension portion, and the cable is fixed on the cable collection member using an effect that the extension portion has elastic deformation.

It should be noted that, the foregoing is merely embodiments, but is not intended to be limited in the embodiments. For example, basic architectures without departing from the invention shall fall within the protection scope claimed by the patent, and should be subject to the scope of the claims.

What is claimed is:

1. A cable management structure, used for limiting a configuration direction of at least one cable, and comprising:
   a substrate, provided with a first surface and a second surface, wherein the first surface and the second surface are correspondingly disposed;
   at least one cable management column, disposed on the first surface of the substrate; and
   at least one cable collection member, disposed at an edge of the substrate, wherein the cable management column is located beside the cable collection member, and the at least one cable is capable of bypassing the cable management column and passing through the cable collection member from the edge of the substrate to the second surface; and
   at least one isolation unit, separated from the at least one cable management column, wherein a portion of the at least one cable passing through the cable collection member from the second surface to the first surface and a portion of the at least one cable bypassing the at least one cable management column are separated on two sides of the at least one isolation unit;
   wherein the cable fits the cable management column, and the configuration direction of the cable is U-shaped.

2. The cable management structure according to claim 1, wherein the cable collection member comprises at least one through groove and at least one extension portion, each through groove is disposed at the edge of the substrate, the extension portion extends out from the edge of the substrate and surrounds at least one portion of the through groove, and the extension portion limits the at least one cable in the through groove.

3. The cable management structure according to claim 1, wherein the at least one isolation unit is disposed at an edge of the cable collection member.

4. The cable management structure according to claim 1, wherein the at least one cable passes through the cable collection member from the second surface to the first surface, and extends back to the second surface through the edge of the substrate after bypassing the at least one cable management column.

5. The cable management structure according to claim 1, wherein the at least one cable management column is arc-shaped, round, or square.

6. A circuit board, applied to an electronic device, the circuit board comprising:
   a substrate, provided with a first surface and a second surface, wherein the first surface and the second surface are correspondingly disposed;
   a plurality of electronic components, disposed on the substrate; and
   at least one cable management structure, used for limiting a configuration direction of at least one cable, the at least one cable management structure comprising:
      at least one cable management column, disposed on the first surface of the substrate;
      at least one cable collection member, disposed at an edge of the substrate, wherein the cable management column is located beside the cable collection member, and the at least one cable is capable of bypassing the cable management column and passing through the cable collection member from the edge of the substrate to the second surface; and
      at least one isolation unit, separated from the at least one cable management column, wherein a portion of the at least one cable passing through the cable collection member from the second surface to the first surface and a portion of the at least one cable bypassing the at least one cable management column are separated on two sides of the at least one isolation unit;
   wherein the cable fits the cable management column, and the configuration direction of the cable is U-shaped.

7. The circuit board according to claim 6, wherein the cable collection member comprises at least one through groove and at least one extension portion, each through groove is disposed at the edge of the substrate, the extension portion extends out from the edge of the substrate and surrounds at least one portion of the through groove, and the extension portion limits the at least one cable in the through groove.

8. The circuit board according to claim 6, wherein the at least one isolation unit is disposed at an edge of the cable collection member.

9. The circuit board according to claim 6, wherein the at least one cable passes through the cable collection member from the second surface to the first surface, and extends back to the second surface through the edge of the substrate after bypassing the at least one cable management column.

10. The circuit board according to claim 6, wherein the at least one cable management column is arc-shaped, round, or square.

* * * * *